(12) United States Patent
Aoki et al.

(10) Patent No.: US 9,202,768 B2
(45) Date of Patent: Dec. 1, 2015

(54) SEMICONDUCTOR MODULE

(71) Applicant: Kabushiki Kaisha Toshiba, Tokyo (JP)

(72) Inventors: Hideo Aoki, Kanagawa (JP); Katsuhiko Oyama, Tokyo (JP); Taku Nishiyama, Kanagawa (JP); Chiaki Takubo, Tokyo (JP); Katsuya Sakai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 13/789,064

(22) Filed: Mar. 7, 2013

(65) Prior Publication Data

US 2014/0252588 A1    Sep. 11, 2014

(51) Int. Cl.
| | |
|---|---|
| *H01L 21/336* | (2006.01) |
| *H01L 23/48* | (2006.01) |
| *H01L 23/367* | (2006.01) |
| *H01L 23/42* | (2006.01) |
| *H01L 23/427* | (2006.01) |
| *H01L 23/467* | (2006.01) |

(52) U.S. Cl.
CPC .......... *H01L 23/367* (2013.01); *H01L 23/3677* (2013.01); *H01L 23/42* (2013.01); *H01L 23/427* (2013.01); *H01L 23/467* (2013.01); *H01L 2224/16225* (2013.01); *H01L 2224/73253* (2013.01); *H01L 2924/15311* (2013.01)

(58) Field of Classification Search
CPC ........................................ H01L 23/367
USPC ................ 257/203, 276, 675, 719, 257/E23.08–E23.113; 438/122, 280
See application file for complete search history.

(56) References Cited

U.S. PATENT DOCUMENTS

| | | | | |
|---|---|---|---|---|
| 6,157,573 A | * | 12/2000 | Ishii et al. | 365/185.24 |
| 7,760,496 B2 | * | 7/2010 | Tsukazawa | 361/679.48 |
| 8,547,703 B2 | * | 10/2013 | Aoki et al. | 361/752 |
| 2014/0068146 A1 | * | 3/2014 | Matsunaga | 711/103 |

* cited by examiner

*Primary Examiner* — Calvin Lee
(74) *Attorney, Agent, or Firm* — Patterson & Sheridan, LLP

(57) ABSTRACT

According to one embodiment, a semiconductor module has a substrate, two nonvolatile memories disposed on a first surface of the substrate, a controller to control the nonvolatile memories, disposed on the first surface of the substrate and between the two nonvolatile memories, and a plurality of terminals that are electrically connected to the two nonvolatile memories and to the controller, disposed on a second surface of the substrate.

19 Claims, 1 Drawing Sheet

SEMICONDUCTOR MODULE

FIELD

Embodiments described herein relate to a semiconductor module.

BACKGROUND

In recent years, semiconductor modules using nonvolatile memories have been used for a memory media in various types of information terminal equipments.

As a component of the semiconductor module, a controller is necessary for controlling the nonvolatile memory, and associated devices. In comparison with the nonvolatile memory, the controller has a higher heat generation rate during operation. Because of the higher heat generation rate, a lot of the heat generated by the controller spread and are held within the semiconductor module. This heat increases the module temperature and may lead to temperature related mis-operation of the nonvolatile memory.

In order to reduce the effect of the controller generated heat on the memory portion, a semiconductor module in which a plurality of nonvolatile memory devices are arranged on one or both surfaces of a substrate and a controller chip arranged at a peripheral part of the substrate has been proposed. As a result, the memory devices are generally remotely located on the underlying substrate, from the controller and from the heat generated thereby. This layout has been adopted in conventional semiconductor modules.

In addition, a ball grid array package in which a controller chip and the nonvolatile memory chip are formed and to which wire bonding and mold sealing are applied has been proposed.

Further, as the capacity of the memory devices increases, faster read, write, and erase operations of the memory devices is required. However, the greater the physical distance between the controller and memory devices, the slower the rate of instructions from the controller to the memory device.

Thus, there is a need to control or otherwise reduce the effect of the heat generated by the controller while operating the memory devices at a high speed and with a high precision.

DETAILED DESCRIPTION

Figure 1:
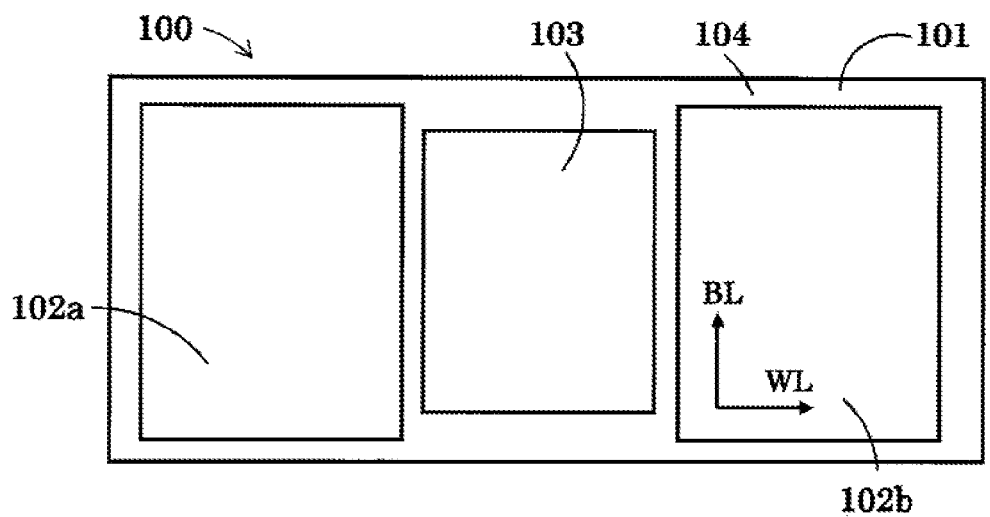
FIG. 1 is a schematic diagram illustrating a planar view of a semiconductor module according to one embodiment.

In general, according to one embodiment, a semiconductor module includes a substrate, two nonvolatile memories disposed on a first surface of the substrate, a controller to control the nonvolatile memories, disposed on the first surface of the substrate and between the two nonvolatile memories, and a plurality of terminals that are electrically connected to the two nonvolatile memories and to the controller, disposed on a second surface of the substrate.

In the following, the embodiment will be explained with reference to the drawings.

Here, the drawings are schematic diagrams illustrating the embodiment. The relationship among the various parts with respect to the thickness and width, and the ratio of the sizes between the various portions may not be to scale. In addition, when the same component or feature is shown in different drawings, the dimensions and ratios thereof may be different. Also, the same reference numerals are used throughout the specification and drawings of the present embodiment for the same feature or element, and the description of the element will not be repeatedly explained in detail.

Figure 2:
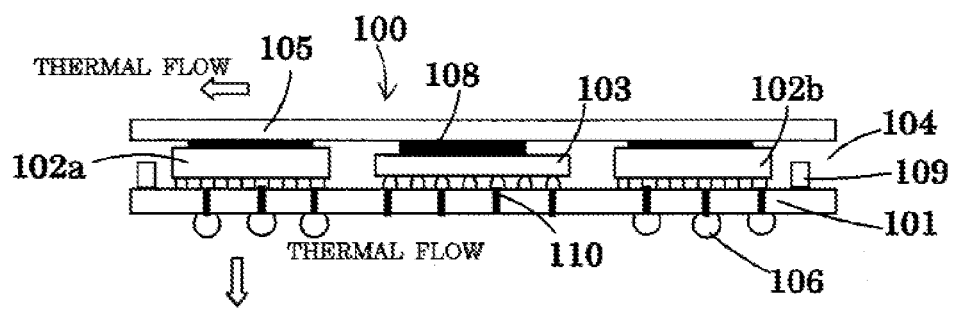
FIG. 2 is a schematic diagram illustrating a cross-sectional view of a semiconductor module according to one embodiment.

FIG. 1 is a schematic diagram illustrating a plan view of a semiconductor module according to an embodiment of the present disclosure. FIG. 2 is a schematic diagram illustrating a cross-sectional view of the semiconductor module according to the embodiment. As shown in FIGS. 1 and 2, a semiconductor module 100 has a multi-chip ball grid array module substrate (hereinafter to be referred to as substrate) 101, and two NAND flash memory devices (hereinafter, NAND memories) 102 (to be referred to together as 102, or individually as 102a and 102b) and one controller device (hereinafter, controller) 103, both of which are formed on the substrate 101. In addition, the semiconductor module 100 has a peripheral region 104 surrounding the NAND memories 102 and the controller 103. Furthermore, the semiconductor module 100 has a heat sink (cooler) 105, which is disposed to form a heat conductance path for the NAND memories 102 and the controller 103, formed above the NAND memories 102 and the controller 103.

The substrate 101 is a printed circuit board. The NAND memories 102 and the controller 103 are formed on a plane (a first surface) of the substrate 101. The two NAND memories 102 are arranged symmetrically with respect to the controller 103 located therebetween. Here, the distance between the controller 103 and the two NAND memories 102 is made as short as practical. As a result, the signal transmission time between the controller 103 and the NAND memory 102a and the signal transmission time between the controller 103 and the NAND memory 102b can be shortened. Moreover, because the wiring lengths between the controller 103 and the NAND memory 102a and between the controller 103 and the NAND memory 102b can be substantially uniform, a smaller dispersion in the transmission times between the signal lines can be achieved. Here, the NAND memories 102 are of multi-channel type, such as 16 channels, 8 channels, and 4 channels.

In addition, in the peripheral region 104, capacitors, resistor elements, regulators, and other inactive elements are disposed if necessary for operation of the module.

Also, by a TIM (thermal interface material) 108, the heat sink 105 is attached to the controller 103 and the NAND memories 102, so that the heat of the controller 103 and the NAND memories 102 is conducted to the exterior of the semiconductor module 100. As a result, the controller 103 and the NAND memories 102 are cooled by conducting the heat generated during their operation. In order to ensure sufficient thermoconductivity and adhesion between the substrate 101 and heat sinks 105, a silver paste or an electroconductive film, or the like is used for the TIM 106. Because of the TIM 106, the thermal resistance is decreased between the heat sink 105 and the NAND memories 102 and between the heat sink 105 and the controller 103.

The heat sink 105 is a series of plates disposed on the one such plate each memory device 102a, 102b and the controller 103. Alternatively, the heat sink 105 may be sized to cover the entire module. In addition, one or more heat pipes may be formed in the heat sink 105. In the heat pipes, a coolant, such as chilled (below the operating temperature of the devices on the module, or at least of the controller) water, alcohol, and the like, flows to cool the heat sink 105. As the heat sink 105 is actively cooled, both the NAND memories 102 and the controller 103 are actively cooled.

The heat sink 105 may additionally, or alternatively, cooled by convections, by flowing air over the exposed surface thereof. On the back surface (a second surface) of the substrate 101, a group of terminals comprising a BGA (ball grid array) 106 are formed. For example, where the substrate 101 has a size of 44 mm×22 mm, each of the NAND memories 102a and 102b has a size of 12 mm×18 mm and the BGA pitch (i.e., spacing between solder balls) of 0.8 mm, and the controller device has a size of 12 mm×15 mm and the BGA pitch of 0.5 mm. The pitch of the BGA 106 is 0.8 mm.

Signals are transmitted in parallel or series between the NAND memories 102 and the controller 103. Signals are transmitted in series between the controller 103 and the terminals of the BGA 106, and between the BGA 106 and the motherboard (not shown in the drawing).

The terminals of the BGA 106 may be connected to an external regulator as well. For example, the terminals of the BGA 106 may be connected to the other DRAM devices or NAND devices by parallel signals. In this case, the serial transmission of the signals are conducted between the BGA 106 and the motherboard, and the serial transmission of the signals are conducted between the BGA 106 and the DRAM/NAND devices.

A build-up substrate is used for wiring of the motherboard, and the lines and spaces are designed to be 25 μm, respectively. In addition, the power supply wiring, the ground wiring, and the signal lines are formed at each layer of the build-up substrate.

The terminals of the BGA 106 are arranged directly below the controller 103 and the NAND memories 102, so that the power supply terminals of the controller 103 and the NAND memories 102 can be connected to the motherboard with a short distance. Consequently, a high speed signal transmission can be achieved. Also, because it is possible to increase the number of the BGA terminals connecting between the motherboard and the power supply/GND terminals, high stability of the power supply system can be achieved. If necessary, a decoupling capacitor may be disposed on the motherboard.

Also, as shown in FIG. 2, through-holes 110 are formed in the substrate 101 and the BGA 106 that are right beneath the controller 103 and the NAND memories 102. In the through-holes 110, for example, copper or other metal is embedded and work as thermal vias. As a result, it is possible to cool the controller 103 and the NAND memories 102.

Figure 3:
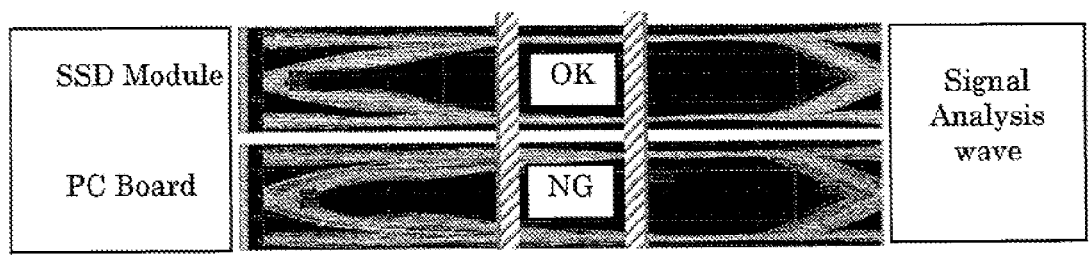
FIG. 3 is a graph illustrating signal analysis waveforms of the semiconductor module according to one embodiment compared with a comparative example.

FIG. 3 is a graph illustrating the signal analysis waveform of the semiconductor module according to the embodiment. The "SSD module" in the upper portion of FIG. 3 shows the present application example, and the "PC board" in the lower portion of FIG. 3 shows a comparative example for comparison.

In the comparative example, two NAND memories are arranged adjacent to each other, and a controller is arranged adjacent to one of the NAND memories. Thus, in the comparative example, two NAND memories are arranged on one side with respect to the controller. On the other hand, in the example according to the embodiment, the two NAND memories 102a and 102b are arranged symmetrically with respect to the controller 103 located therebetween.

Here, the transmission quality of an example according to the embodiment and that of the comparative example are compared with each other. According to the example according to the embodiment, random access is carried out at a rate of 400 Mbps to the NAND memories, and degradation of the waveform is analyzed. On the other hand, this method is also used to compare the operation of any two NAND memory modules. The results are shown in the eye diagrams of FIG. 3.

In FIG. 3, transitions of the signal waveforms based on time are sampled and superposed to be displayed as a graph. Here, the ordinate represents the voltage applied to the NAND memories, and the abscissa represents the time. If the waveforms are superposed at the same position, the waveforms are of high quality, and if the waveforms are shifted from each other the waveforms are of low quality.

FIG. 3 shows that the rising and falling waveforms of the example according to the embodiment are steeper than the rising and falling waveforms of the comparative example. Thus, the time for the voltage to reach a nearly constant level (within the hatched portion in FIG. 3) in the example according to the embodiment (the left hand hatched portion of FIG. 3) is faster than the time in the comparative example (the right hand hatched portion of FIG. 3). This shows that electrical characteristics of the example according to the embodiment are better than that of the comparative example.

The superior electrical characteristics that result from the configuration of the embodiment allow the controller 103 and the two NAND memories 102 to be arranged with equal and short distances therebetween. Because of the configuration, the signal transmission times can be shortened and equal to each other. On the other hand, in the comparative example, because the distance between at least one of the two NAND memories and the controller is longer, the signal transmission times cannot be sufficiently shortened and uniformed.

As explained above, according to the embodiment, the two NAND memories 102 are arranged symmetrically with respect to the controller 103, so that excellent electrical characteristics can be achieved. In addition, the good cooling function of the semiconductor module by the heat spreader and the thermal vias can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for cooling a semiconductor module comprising a substrate, two nonvolatile memories disposed on a first surface of the substrate, and a controller to control the nonvolatile memories disposed on the first surface of the substrate and between the two nonvolatile memories, the method comprising:

disposing a ball grid array that is electrically connected to the nonvolatile memories and the controller, on a second surface of the substrate, so that heat generated by the nonvolatile memories and the controller is conducted to the ball grid array, the ball grid array being positioned directly below each of the two nonvolatile memories, the ball grid array being connectable to an external device.

2. The method according to claim 1, further comprising:

disposing in the substrate a plurality of metal vias, which electrically connect between the two nonvolatile memories and the ball grid array, and between the controller and the ball grid array in the substrate.

3. The method according to claim 1, further comprising:
disposing a cooler over the two nonvolatile memories and the controller, so that the heat generated by the nonvolatile memories and the controller is also conducted to the cooler.

4. The method according to claim 3, further comprising:
flowing a coolant in a heat pipe disposed in the cooler.

5. The method according to claim 3, further comprising:
disposing a thermal interface between the cooler and each of the nonvolatile memories, and between the cooler and the controller.

6. A semiconductor module, comprising:
a substrate;
at least two nonvolatile memories disposed on a first surface of the substrate;
a controller to control the nonvolatile memories, disposed on the first surface of the substrate and between the at least two nonvolatile memories; and
a ball grid array that is electrically connected to the controller, disposed on a second surface of the substrate, the ball grid array being positioned below the two nonvolatile memories, the ball grid array being connectable to an external device.

7. The semiconductor module according to claim 6, wherein
the nonvolatile memories are NAND flash memories.

8. The semiconductor module according to claim 6, wherein
a plurality of metal vias extend through the substrate, and
the metal vias electrically connect between the two nonvolatile memories and the ball grid array and between the controller and the ball grid array.

9. The semiconductor module according to claim 6, wherein
a distance between one of the two nonvolatile memories and the controller is substantially the same as a distance between the other of the two nonvolatile memories and the controller.

10. The semiconductor module according to claim 6, further comprising:
a cooler disposed over the two nonvolatile memories and the controller.

11. The semiconductor module according to claim 10, wherein
the cooler includes at least one heat pipe in which a coolant flows.

12. The semiconductor module according to claim 10, wherein
the cooler includes a plurality of heat pipes in which a coolant flows.

13. The semiconductor module according to claim 10, further comprising:
a thermal interface disposed between the cooler and each of the nonvolatile memories and between a heat sink and the controller.

14. The semiconductor module according to claim 13, wherein
the thermal interface comprises a plurality of thermal interface members that are disposed on the nonvolatile memories and the controller, respectively.

15. A semiconductor module, comprising:
a substrate;
two nonvolatile memories disposed on a first surface of the substrate;
a controller to control the nonvolatile memories, disposed on the first surface of the substrate and between the two nonvolatile memories;
a ball grid array disposed on a second surface of the substrate below the two nonvolatile memories; and
a cooler disposed over the two nonvolatile memories and the controller.

16. The semiconductor module according to claim 15, wherein
the nonvolatile memories are NAND flash memories.

17. The semiconductor module according to claim 15, wherein
the cooler includes at least one heat pipe in which a coolant flows.

18. The semiconductor module according to claim 15, further comprising:
a thermal interface disposed between the cooler and each of the nonvolatile memories, and between the cooler and the controller.

19. The semiconductor module according to claim 15, wherein
a distance between one of the two nonvolatile memories and the controller is substantially the same as a distance between the other of the two nonvolatile memories and the controller.

* * * * *